(12) United States Patent
Geffken et al.

(10) Patent No.: US 6,180,498 B1
(45) Date of Patent: Jan. 30, 2001

(54) ALIGNMENT TARGETS HAVING ENHANCED CONTRAST

(75) Inventors: Robert Michael Geffken; Robert Kenneth Leidy, both of Burlington, VT (US)

(73) Assignee: International Business Machines Corporation, Armonk, NY (US)

(*) Notice: Under 35 U.S.C. 154(b), the term of this patent shall be extended for 0 days.

(21) Appl. No.: 09/004,557

(22) Filed: Jan. 8, 1998

Related U.S. Application Data

(62) Division of application No. 08/801,427, filed on Feb. 18, 1997, now Pat. No. 5,898,227.

(51) Int. Cl.⁷ .................. H01L 21/76; H01L 21/4763; H01L 21/302; H01L 21/461
(52) U.S. Cl. .................. 438/462; 438/401; 438/618; 438/642; 438/692; 438/975
(58) Field of Search .................. 438/618, 637, 438/642, 692, 401, 462, 975; 257/797

(56) References Cited

U.S. PATENT DOCUMENTS

| | | |
|---|---|---|
| 4,385,238 | 5/1983 | Westerberg et al. . |
| 4,632,557 | 12/1986 | Thompson . |
| 4,968,637 | 11/1990 | Mozzi et al. . |
| 5,160,403 * | 11/1992 | Fisher et al. .................. 156/633 |
| 5,264,310 | 11/1993 | Kawai . |
| 5,334,466 | 8/1994 | Yasui et al. . |
| 5,482,893 * | 1/1996 | Okabe et al. .................. 438/618 |
| 5,525,840 * | 6/1996 | Tominaga .................. 257/797 |
| 5,627,110 * | 5/1997 | Lee et al. .................. 438/692 |
| 5,663,099 * | 9/1997 | Okabe et al. .................. 438/642 |
| 5,665,645 * | 9/1997 | Kinugawa .................. 438/637 |

FOREIGN PATENT DOCUMENTS 62-025415  2/1987 (JP) .

* cited by examiner

Primary Examiner—Carl Whitehead, Jr.
Assistant Examiner—James Park
(74) Attorney, Agent, or Firm—Schmeiser, Olsen & Watts; Mark F. Chadurjian

(57) ABSTRACT

Various alignment targets are disclosed having improved visibility. A first embodiment includes an alignment target having a first reflective layer of a first material such as tungsten having a roughened surface; and a second layer of a second material, such as aluminum, deposited on the first layer. The surface of the second layer is roughened by conforming with the roughened surface of the first layer to provide both layers with a uniform optical layers. The edges of the second layer provides an optical signal to contrast between the two layers for alignment. A second embodiment includes an alignment target with a plurality of parallel elongated trenches; a first material fills each of the trenches; and a patterned layer of a second material is deposited on top the elongated trenches and the insulator layer.

18 Claims, 2 Drawing Sheets

ALIGNMENT TARGETS HAVING ENHANCED CONTRAST

This application is a divisional of application Ser. No. 08/801,427, filed on Feb. 18, 1997 now U.S. Pat. No. 5,898,227. The entire disclosure of that prior application is considered as being part of the disclosure of this application and is hereby incorporated by reference herein.

BACKGROUND OF THE INVENTION

1. Field of the Invention

The present invention relates generally to alignment targets or marks for use in photo lithography masking operations of integrated circuit (IC) chips and more specifically to alignment targets having enhanced contrast.

2. Description of the Related Art

The surface of the IC wafer during Back End Of the Line (BEOL) processing does not tend to have great reflectivity contrast between components (e.g., wiring levels). In contrast, during Front End Of the Line (FEOL) processing, the base material does provide reflectivity. In particular, at the BEOL stage, during semiconductor processing, wiring levels are separated by thick layers of insulating materials. Each wiring level is a reflective film and the insulating films are usually highly transparent at the alignment wavelength. To align to these wiring levels, alignment marks or targets are placed in the IC wafer to provide reflectivity contrast. Alignment targets generally include a series of indicia on the surface or subsurface of a substrate which are used to align masking patterns for photo lithographic machinery. The alignment target is used for not only locating a particular position on the wafer, but is also used to align the wafer in two axes. The degree of accuracy of the alignment is a function of the resolution and contrast of the optical system. As IC chips become smaller and smaller, the challenge for alignment targets having adequate contrast for resolution increases.

Two alignment systems used to provide reflectivity contrast are a bright field alignment system and a dark field alignment system. In a bright field alignment system, contrast is seen between the light reflecting off of the metal wiring level's alignment mark and the background light reflected off of underlying reflective films (usually the silicon wafer itself). The metal can be from 1 to 7 $\mu$m above these underlying films making it difficult to focus both simultaneously. The thickness of the insulating film on top of the mark (and the photo resist on top of that) determines whether the reflection will be dark or light due to the thin film interference effect. Variations in the thickness of this insulating layer driven by the deposited insulator as well as the chemical mechanical polish planarization (or other planarization techniques) can cause the mark to be light or dark within a wafer. This makes the algorithm that detects the mark having a resultant signal that fails. This variation in insulator thickness is also apparent in the background signal as reflected back out of focus from the underlying reflector. Because of these problems, bright field marks are difficult to use for alignment.

A dark field alignment mark cancels out the directly reflected light coming from edges of an alignment mark. Thus, a strong reflectivity contrast signal can be seen from the edges of the mark. A difficulty in dark field alignment is that process variations cause changes in the slopes of metal wires across a mark causing an apparent shift in the detected mark position. The problem of these process variations are due to etch variations caused by pattern density differences across the wafer and even within the mark itself. The etch process for the metal lines erodes the photo resist defining the lines at rates determined by pattern density thus changing the slope of the metal lines while they remain the correct dimension at the bottom.

Heretofore, various techniques have been used to enhance the contrast of alignment marks on IC wafers to improve resolution and accuracy. U.S. Pat. No. 4,632,557, entitled ALIGNMENT TARGET IMAGE ENHANCEMENT FOR MICROLITHOGRAPHY PROCESS and assigned to Harris Corporation, discloses an alignment target having a reflective region surrounded by a light scattering region on a substrate to increase contrast. The width of the reflective portion of the light scattering region is substantially smaller than the width of the target region along the orthogonal axis of the substrate. The light scattering region includes a plurality of peaks and valleys having parallel axes which are oblique to the axis of the substrate.

Japanese publication No. 62-025415, entitled ALIGNMENT MARK AND MANUFACTURE THEREOF, published on Feb. 3, 1987 and assigned to Cannon Inc., discloses an alignment mark having differing heights due to two patterns which cross one another (FIG. 3c). The first pattern is formed by PSG (polysilicon glass) and is square shaped. The first pattern crosses a second pattern formed by a nitride film and having a plurality of valleys therein. The interference of light differentiates due to the height of the steps of the two patterns crossing one another.

Other patents which disclose various types of alignment marks include: U.S. Pat. No. 5,334,466, entitled X-RAY MASK AND PROCESS COMPRISING CONVEX-CONCAVE ALIGNMENT MARK WITH ALIGNMENT REFLECTION FILM, assigned to Matsushita Electric Industrial Co.; U.S. Pat. No. 4,986,637, entitled METHOD OF MANUFACTURE TIW ALIGNMENT MARK AND IMPLANT MASK, assigned to Raytheon Company; and U.S. Pat. No. 5,264,310, entitled ALIGNMENT MARK HAVING REGIONS FORMED BY ENERGY BEAM IRRADIATION THEREIN AND METHOD OF MANUFACTURING THE SAME, assigned to Mitsubishi Denki Kabushiki Kaisha. All the references cited herein are hereby incorporated by reference. The summary of each reference described herein should not be relied upon or substituted for a thorough reading of each individual reference. None of the aforementioned difficulties of detecting a marks position in dark field alignment have been adequately addressed by the above references.

SUMMARY OF THE INVENTION

The present invention is an apparatus and method for providing an alignment target having a metal surface for improved alignment visibility in the presence of thin film interference. The alignment system of the present invention uses a single wavelength illumination source that is sensitive to thin film interference effects. The present invention overcomes the above discussed problem of insulator thickness inherent in thin film interference by providing a uniform optical background on alignment marks to provide greater reflectivity contrast.

The alignment mark or target of the present invention in a first embodiment includes a first reflective layer to provide a uniform optical background, the first material is preferably tungsten having a roughened surface deposited on an insulator layer, such as an oxide. A second layer of a second material, such as aluminum is deposited above the first layer. The second layer conforms with the roughened surface of the first layer. The first layer includes a portion which is polished and extends above a roughened surface. The second layer then conforms to the roughened surface of the first layer. The edges between the second layer and first layer provide enhanced contrast during alignment. For example, the second layer has a uniform height difference to provide enhanced contrast in bright field alignment. This provides the advantage of having greater reflectivity contrast without the disadvantage of stepped material and yield loss due to increased debris.

In a second embodiment, an alignment target includes a plurality of parallel elongated trenches formed in an insulator layer; a first material fills each of the plurality of said trenches; and a patterned layer of a second material is deposited above said trenches. The plurality of trenches provide the advantage of providing a uniform optical background. The edges are subresolution, thus, they appear as an average brightness to the optical detection device. The increased number of subresolution edges, when averaged, provides an optically uniform background for enhanced visibility contrast between the first layer and the second layer at the edges of the second layer. The greater the number the edges contained in the first layer, the greater the apparent brightness and reflectivity contrast of the alignment mark.

BRIEF DESCRIPTION OF THE DRAWINGS

The preferred exemplary embodiment of the present invention will hereinafter be described in conjunction with the appended drawings, where like designations denote like elements, and.

DETAILED DESCRIPTION OF A PREFERRED EMBODIMENT OF THE PRESENT INVENTION

Figure 1:
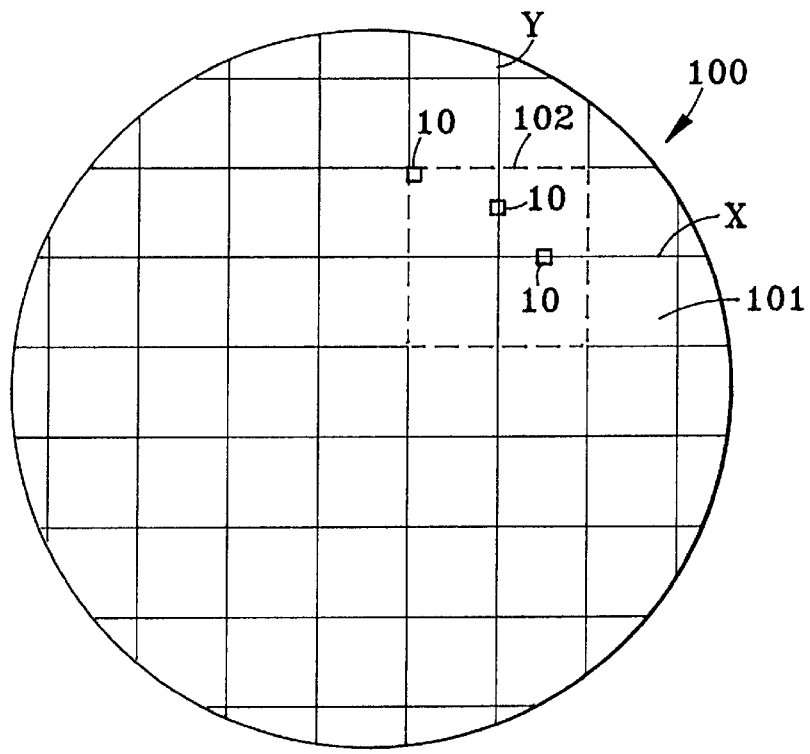
FIG. 1 is a top view of a wafer showing IC chip regions, kerf regions and alignment marks in a portion of a kerf.

FIG. 1 shows a top view of a semiconductor wafer 100. Masking of the semiconductor wafer 100 is broken into various regions, such as kerf region 102 and IC chip region 101. Each region 102 may be varied in size depending upon the processing steps to be performed on the kerf 102. An IC chip region 101 may be divided into one or more IC semiconductor chips. Alignment marks 10 are used to align the photo lithographic equipment (i.e., the lense) in the X and Y axes. Alignment marks 10 are also placed in the corners of the region 102 to align for rotation.

Figure 2:
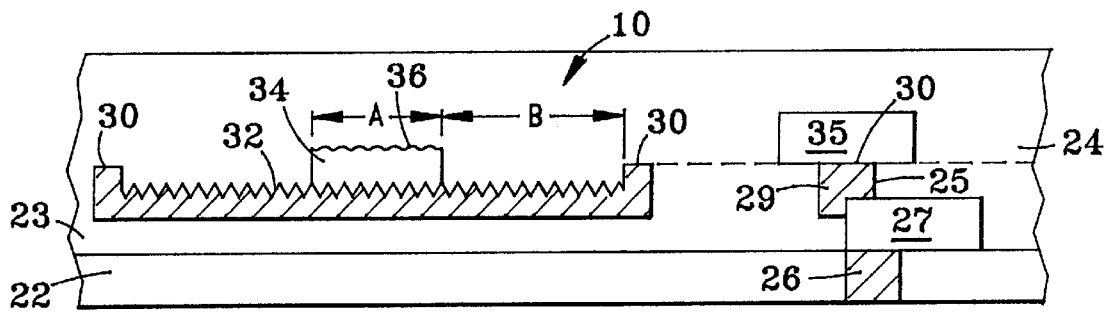
FIG. 2 is a side view of an alignment mark of a first preferred embodiment of the present invention.
Figure 3:
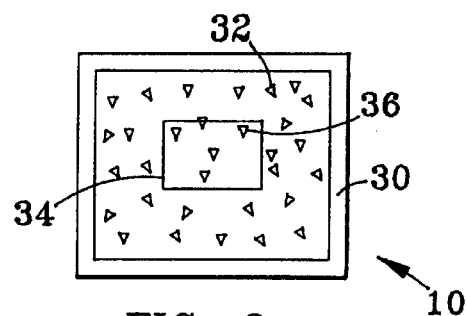
FIG. 3 is top view of an alignment mark of a first preferred embodiment of the present invention.

Referring to FIGS. 2 and 3, a side view and a top view of an alignment mark 10 having a first reflective layer 32 with a roughened metal surface and a second reflective layer 34 with a roughened metal surface 36 are shown. The first reflective layer 32 is preferably made from tungsten and the second layer 34 is preferably made from aluminum. The alignment mark 10 is surrounded by an edge 30.

FIG. 2 is a cutaway side view of alignment mark 10 and a contact via 20 on a semiconductor device of the present invention. The semiconductor device includes a first insulator region 22 having a layer 26 of a first material deposited in a via hole in said layer. The first layer 26 is a metallization deposit of a material having a low resistivity, such as a refractory metal (tungsten, molybdenum, etc.), a Chemical Vapor Deposition metal (aluminum (Al), copper(Cu)), an electroplated Cu, electroplated Cu alloys, electroless Cu, and electroless Cu alloys. The first layer 26 may either be a single layer of a single metal or a plurality of metal layers of various metals and alloys thereof.

The second layer 27 is a metallization deposit such as aluminum, copper, copper alloys, or other low conductivity metals such as silver, silver alloys or gold. A second insulator layer 23 is deposited over layer 27 and planarized with a process such as chemical mechanical polish (CMP). Alignment mark 10 is etched in the second oxide layer 23 during the same process which opens contact via 25. Layer 29 of the contact via is also deposited on layer 27 while depositing layer 32 of the alignment mark 10. Layer 29 and 32 are made from the same material as the first layer 26. At this stage in the process, a chemical mechanical polish (CMP) is used to smooth out via contact layer 29 and the edge surfaces 30 on the alignment mark 10. Next, second layer 34 and metallization layer 35 are deposited. Second layer 34 and metallization layer 35 are the same materials described for layer 27. The second layer 34 has an upper roughened surface 36 that replicates the lower roughened surface of the first layer 32. The first layer 32 provides a uniform optical background for enhanced contrast between the first reflective layer 32 and the second reflective layer 34. The upper surface 35 is not roughened because it replicates the surface of via layer 29 which is smooth. This technique is used because, for example, aluminum does not deposit with a rough surface similar to tungsten. The rough surface provides the uniformity needed for optical detection of the edges of layer 34. For this reason the roughened surface 32 (e.g., tungsten) is used to provide the roughened surface 36 (e.g., for the aluminum).

After the layer 34, 35 has been deposited patterned and etched in the metal forming alignment mark 10, a third insulator oxide layer 24 is then deposited and planarized. The distance across the aluminum alignment mark 34 is 4 microns as represented at A and the distance B between the aluminum 34 and edge 30 is at least 15 microns. The large area on the first layer 32 allows for slight variability in placement of the second layer 34.

Figure 4:
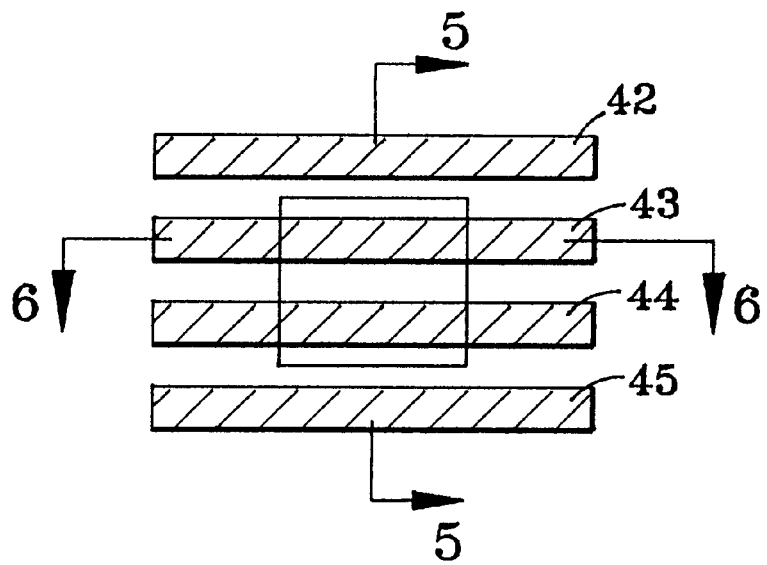
FIG. 4 is a top view of an alignment mark of a second preferred embodiment of the present invention.
Figure 5:
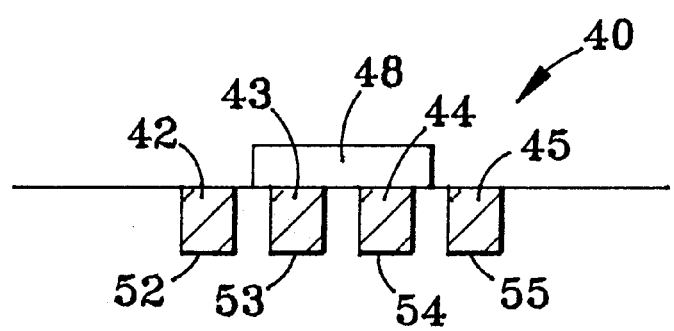
FIG. 5 is a side view of an alignment mark of a second preferred embodiment of the present invention as shown from a first side.
Figure 6:
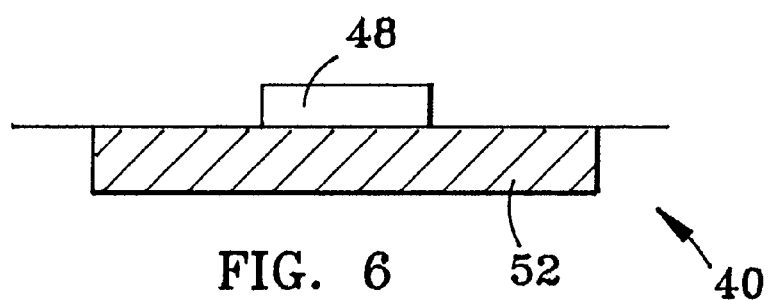
FIG. 6 is a side view of an alignment mark of a second preferred embodiment of the present invention as shown from a second side.

FIGS. 4–6 show a second embodiment of this invention. The second embodiment is preferably for use in a dark field. In a dark field the edges show up as light spots. Thus, the greater the number of edges formed by the elongated trenches and in contrast of the markings and surrounding oxide show up as dark spots. The edges of 42–45 are subresolution and thus are viewed as an average brightness. It is important that the alignment markings are not transparent. The oxide region tends to be transparent. Accordingly, subsurface alignment marks may be used. In the second embodiment shown in FIGS. 5 and 6 alignment wells 52, 53, 54 and 55 are etched into an oxide layer. The trenches 52, 53, 54 and 55 are then filled with tungsten 42, 43, 44 and 45 respectfully. The trenches 52–55 are perpendicular to the X-axis and Y-axis as shown in FIG. 1.

This invention is based on the fact that roughened surfaces reflect light differently from polished surfaces and that tungsten deposits with a rough surface. In a first embodiment the starting point is a planarized oxide surface before depositing the first via. A wide alignment well is printed and etched along with the normal vias. The width of the well is wide enough not to fill with tungsten in subsequent steps. Tungsten is then deposited (it will have a rough surface). Next a CMP step is performed. The CMP process utilizes a relatively hard polish pad which will not deform into the alignment mark and polish the roughened W surface. After normal Aluminum deposition, pattern and etch, the metal forming the alignment mark will replicate the roughened tungsten layer in the alignment well. Insulator oxide is then deposited and planarized. The resultant structures are shown in FIG. 2.

A second embodiment uses a similar process sequence, but instead of etching a alignment well, a series of parallel trenches that completely fill with tungsten are formed. These trenches run in the same axis that the alignment system works in relative to the wafer.

What is claimed is:

1. A method for forming an alignment mark, said steps comprising:

providing a plurality of process layers on a semiconductor wafer;

etching at least one of said layers;

depositing a first reflective layer on at least one of said process layers; and depositing a second reflective layer on said first reflective layer, wherein the first and second reflective layers provide a substantially uniform optical background, and edges of said second reflective layer provide contrast for alignment of said semiconductor.

2. The method of claim 1, wherein the plurality of process layers includes at least two process layers.

3. The method of claim 1, wherein the method further comprises the step of forming an upper surface of the second reflective layer to match a roughness of an upper surface of the first reflective layer.

4. The method of claim 1, wherein the step of depositing a first reflective layer includes depositing the first reflective layer with a rough upper surface; and wherein the method further comprises the step of forming an upper surface of the second reflective layer to match the roughness of the upper surface of the first reflective layer.

5. The method of claim 1, wherein the plurality of process layers includes a first process layer, a second process layer and a third process layer.

6. The method of claim 5, wherein the step of depositing the first reflective layer includes depositing the first reflective layer on the second process layer.

7. The method of claim 5, wherein each process layer includes at least one via therein.

8. A method of forming a semiconductor, the method comprising the steps of:

depositing a first reflective layer on a process layer; and depositing a second reflective layer on the first reflective layer, wherein the first and second reflective layers provide a substantially uniform optical background, and edges of the second reflective layer provide an optical signal for alignment.

9. The method of claim 8, wherein upper surfaces of the first reflective layer and the second reflective layer have substantially identical roughness.

10. The method of claim 8, wherein the first reflective layer is chosen from the group consisting of tungsten and molybdenum.

11. The method of claim 8, wherein the first reflective layer is chosen from the group consisting of C.D. copper, C.D. aluminum, electroplated copper, electroplated copper alloy, electrolysis copper, and electrolysis copper alloy.

12. The method of claim 8, wherein the second reflective layer is one of aluminum, aluminum alloy, copper, copper alloy, silver, silver alloys and gold.

13. The method of claim 8, wherein the first reflective layer includes edges which provide enhanced optical visibility, and the method further comprises the step of planarizing the edges of the first reflective layer prior to depositing the second reflective layer.

14. A method for forming an alignment mark, the method comprising the steps of:

providing a planarized process layer;

creating a plurality of trenches in the process layer;

depositing a first material that deposits with a rough surface into the plurality of trenches; and depositing a second material on the first material, wherein the first and second materials provide a substantially uniform optical background, and edges of the second material provide contrast for alignment.

15. The method of claim 14, wherein the process layer is oxide.

16. The method of claim 14, wherein the material is tungsten.

17. The method of claim 14, further comprising the step of depositing an insulating layer.

18. The method of claim 14, wherein the step of creating a plurality of trenches includes creating the plurality of trenches such that the trenches have edges for enhanced optical visibility.

* * * * *